(12) United States Patent
Krapf et al.

(10) Patent No.: US 8,860,435 B2
(45) Date of Patent: Oct. 14, 2014

(54) LOCATING APPLIANCE

(71) Applicant: Robert Bosch GmbH, Stuttgart (DE)

(72) Inventors: Reiner Krapf, Filderstadt (DE); Tobias Zibold, Stuttgart (DE); Andrej Albrecht, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 158 days.

(21) Appl. No.: 13/670,212

(22) Filed: Nov. 6, 2012

(65) Prior Publication Data

US 2013/0120004 A1 May 16, 2013

(30) Foreign Application Priority Data

Nov. 7, 2011 (EP) .................................... 11188062

(51) Int. Cl.
*G01V 3/08* (2006.01)
*G01V 3/00* (2006.01)
*G01R 27/04* (2006.01)
*G01R 11/06* (2006.01)
*G01V 3/10* (2006.01)

(52) U.S. Cl.
CPC *G01R 27/04* (2013.01); *G01V 3/08* (2013.01); *G01R 11/06* (2013.01); *G01V 3/10* (2013.01)
USPC ............ 324/647; 324/326; 324/329; 324/347

(58) Field of Classification Search
CPC .......... G01R 27/04; G01R 11/06; G01V 3/10; G01V 3/08
USPC ........... 324/67, 326–329, 331, 347, 654–657, 324/647
See application file for complete search history.

(56) References Cited

U.S. PATENT DOCUMENTS

| 4,859,931 A | 8/1989 | Yamashita et al. |
| 6,211,662 B1 * | 4/2001 | Bijawat et al. ................. 324/67 |
| 2003/0006761 A1 | 1/2003 | Hiramatsu et al. |

FOREIGN PATENT DOCUMENTS

| CN | 101943759 A | 1/2011 |
| DE | 41 41 264 C1 | 3/1993 |
| DE | 10 2008 005 783 A1 | 7/2009 |
| DE | 10 2010 028 718 A1 | 11/2011 |
| DE | 10 2010 028 723 A1 | 11/2011 |
| DE | 10 2010 031 147 A1 | 11/2011 |
| JP | 2005-210146 A | 8/2005 |

* cited by examiner

*Primary Examiner* — Melissa Koval
*Assistant Examiner* — Farhana Hoque
(74) *Attorney, Agent, or Firm* — Maginot, Moore & Beck

(57) ABSTRACT

A locating appliance configured to sense an article includes a push-pull measurement bridge and a comparator. The push-pull measurement bridge is configured to actuate a first electromagnetic device and a second electromagnetic device, in each case in a variable ratio. The first electromagnetic device takes the actuation as a basis for producing an electromagnetic alternating field in a region of the article. The comparator is configured to sense the article if the variable ratio differs from a predetermined ratio by more than a predetermined amount.

14 Claims, 5 Drawing Sheets

LOCATING APPLIANCE

This application claims priority under 35 U.S.C. §119 to patent application no. EP 11 188 062.1, filed on Nov. 7, 2011 in the European Patent Office, the disclosure of which is incorporated herein by reference in its entirety.

BACKGROUND

The present disclosure relates to a locating appliance. In particular, the present disclosure relates to a locating appliance configured to detect an object enclosed in a medium.

Various locating appliances are known for sensing an article concealed in a wall. The article concealed in the wall may be a water, power or gas line, for example, which must not be damaged when working on the wall. On the other hand, the article may also be a wooden beam or another supporting structure, and the work needs to be carried out in the region of the supporting structure.

In order to trace a metallic article, such as a steel water pipe, within the wall, a magnetic field is usually produced and a check is performed to determine whether the article influences the magnetic field. If the influence exceeds a predetermined amount, the article is sensed. A nonmetallic article, such as a wooden beam, can be detected by using its dielectric properties. To this end, an electrical field is produced and a check is performed to determine the extent to which the article influences the electrical field. The article is sensed if the influence exceeds a predetermined amount. If the article is a conductor carrying current or voltage, it is also possible to detect an electromagnetic field surrounding the conductor. Articles which are neither metallic nor have easily detectable dielectric properties, such as a copper power line encased in plastic, can be sensed in this way.

A fundamental problem for locating appliances is that they tend to produce false measurements when a sensing sensitivity is increased. The locating appliances therefore need to be calibrated by a user in the region of the measurement location. The calibration can render the measurement process complex and ambiguous.

The disclosure is based on the object of providing a sensitive locating appliance which is easy to use.

SUMMARY

The disclosure solves the problem by means of a locating appliance having the features described herein.

A locating appliance according to the disclosure for sensing an article, particularly an object enclosed in a medium, comprises a push-pull measurement bridge for actuating a first and/or a second electromagnetic device. Such a push-pull bridge is known in DE 10 2010 028 723 A1 or DE 10 2010 031 147 A1, for example, for an inductive electromagnetic device. DE 10 2010 028 718 A1 shows such a push-pull bridge for a capacitive electromagnetic device. Such a push-pull measurement bridge has an oscillator for supplying the capacitive electrodes (in the case of the capacitive electromagnetic device) or the coils (in the case of the inductive electromagnetic device) with phase-shifted AC voltages. In addition, such a push-pull measurement bridge has a control device for controlling amplitudes of at least one of these AC voltages.

In the case of the inductive electromagnetic device, the transmission coils have alternating voltages applied to them, as a result of which an AC voltage component which is in sync with the alternating voltages and which, by way of example, is detected by means of a reception coil, i.e. is induced therein, is minimized in terms of absolute value.

Alternatively, the inductive electromagnetic device can also dispense with a reception coil, and an AC voltage component of the differential voltage, which AC voltage component is in sync with the alternating voltages, can be measured and minimized in terms of absolute value. By way of example, this can be accomplished by a device comprising two series-connected nonreactive resistors, which may each be part of the complex resistance of the transmission coils.

In the case of the capacitive electromagnetic device, the capacitance device, i.e. the capacitive electrodes, have alternating voltages applied to them. The control device is set up to amplify the alternating voltages such that an AC voltage component that is in sync with the alternating voltages is minimized By way of example, the AC voltage component can be measured by using a potential probe, in line with the arrangement shown in FIG. 1 in DE 10 2010 028 718 A1.

The first electromagnetic device takes the actuation as a basis for producing an electromagnetic alternating field in the region of the article. A comparator in the locating appliance senses the article if the variable ratio differs from a predetermined ratio by more than a predetermined amount.

As already explained, the push-pull measurement bridge is known in principle from other applications in the prior art, for example also from DE 10 2008 005 783 A1, which does not disclose a locating appliance for detecting objects enclosed in a medium, however.

Such a push-pull measurement bridge can be used for field-compensated measurement, as a result of which it is possible to combine a large measurement region with a high level of sensitivity for the locating appliance. In addition, the push-pull measurement bridge can be used for differential measurement, which means that it is possible to dispense with calibration by a user of the locating appliance. The push-pull measurement bridge can be used for measurement alternatively by means of a magnetic or electrical field. The respective other component of the electromagnetic field is virtually zero in this case.

In one embodiment of the locating appliance according to the disclosure, a push-pull measurement bridge is provided for the purpose of using a changeover switch to selectively actuate a first electrical device and/or a first electrical device.

In this case, the first electrical device comprises at least two coils, particularly transmission coils, and is used as an inductive sensor, which allows metallic objects to be detected, for example.

The second electrical device comprises at least two capacitive electrodes and is used as a capacitive sensor, which allows dielectric objects to be detected, for example.

Advantageously, the actuating apparatus in the form of a push-pull measurement bridge is in the form of an IC (Integrated Circuit), particularly in the form of an ASIC, and is arranged in the housing of the apparatus.

The locating appliance according to the disclosure has an output device, particularly in the form of a panel display, such as an LCD display, which allows the output of a signal indicating the object, particularly a visual signal. The locating appliance according to the disclosure allows the signal indicating an object also to indicate, in particular, what type of article (metallic, magnetic, wood, current-carrying line and the like) has been sensed.

The locating appliance may comprise a device for a user to alter the predetermined amount. This allows the user to set the sensitivity of the locating appliance. The predetermined amount can be set in line with a gain for control signals which are supplied to the first and second electromagnetic devices, so that the electromagnetic fields produced are amplified accordingly. In one embodiment, the predetermined amount can be changed over between a plurality of predetermined values, for example two or three values, so that the locating appliance has various sensitivities which can simply be selected by the user.

Furthermore, in one embodiment, the locating appliance according to the disclosure has a displacement sensor for sensing a displacement of the locating appliance relative to the article. The locating appliance is particularly designed to associate a measurement result from the push-pull measurement bridge with a displacement position of the appliance. In this way, it is also possible for location coordinates to be associated with a detected object.

In one embodiment of the locating appliance according to the disclosure, a further push-pull measurement bridge having a further electromagnetic device is present. This further electromagnetic device may be an inductive, capacitive or else other sensor unit.

This further push-pull measurement bridge may be integrated in the same IC/ASIC as the first push-pull bridge or else in a second IC/ASIC and may be fitted in the locating appliance.

In the case of the locating appliance according to the disclosure, at least one of the electromagnetic devices which is actuated by means of a push-pull measurement bridge is arranged on one side of the housing of the appliance, particularly on that side of the housing which is remote from the output device, within the housing.

The locating appliance according to the disclosure has at least one battery, particularly at least one battery in the form of a rechargeable battery, for supplying power.

In one alternative embodiment of the locating appliance according to the disclosure, a first electromagnetic device can successively produce a magnetic field and an electrical field in the region of the article. To this end, the electromagnetic device may comprise a coil and an electrode which are successively connected to the push-pull measurement bridge.

In one embodiment, electromagnetic devices that correspond to one another are used. In this case, the push-pull measurement bridge may be of a design such that a third electromagnetic device takes on a field which has the variable ratio in respect of the other two electromagnetic devices. Alternatively, electrical parameters from the first and second electromagnetic devices can be compared with one another in order to determine the variable ratio. In a further embodiment, the second electromagnetic device does not produce a field, but rather forms an electrical load for the push-pull measurement bridge, which forms the variable ratio with the electrical load from the first electromagnetic device.

In addition, the locating appliance may comprise an apparatus for determining an electrical field from the article, with the article being sensed successively on the basis of a push-pull measurement bridge and the apparatus. Preferably, the article is sensed when it is sensed by means of at least one of the three approaches described. In this case, an output device in the locating appliance can, upon sensing the article, output a signal which indicates on the basis of what type of field the article has been sensed, or what type of object is involved. A first signal can indicate a measurement which has been performed by means of the push-pull measurement bridge and a magnetic field, a second signal can indicate a measurement which has been performed by means of the push-pull measurement bridge and an electrical field, and a third signal can indicate a measurement which has been performed by means of the apparatus for determining the electrical field from the article. The signal may be at least one from a choice of visual and audible.

One embodiment of the locating appliance according to the disclosure may have a multiplicity of first electromagnetic devices which are arranged next to one another and which are successively operated on the push-pull measurement bridge. This allows the article to be sensed in one or two dimensions, which means that the article can be localized more precisely or a boundary of the article, for example an edge, can be found more easily.

In one embodiment, the measurement results attained using the various first electromagnetic devices are visually displayed by defining display regions on a visual output device which are each associated with one of the first electromagnetic devices. In this case, the arrangement of the display regions preferably corresponds to the arrangement of the first electromagnetic devices. A user can thus be presented with a visual representation of the measurement result which can be grasped intuitively and has a high level of detail.

A distance of the article from the locating appliance can correspond to a change of color in the visual output device. If the visual output device is kept simple, and hence inexpensive, for example in the form of a few light-emitting diodes, then the change of color allows the measurement result to be presented more precisely with little complexity, it being possible to use multicolored LEDs or backlit LCD displays. If the visible output device is more complex, for example in the form of a graphical panel output with color capability, such as a liquid crystal display with graphics capability, then the removal of the article can be presented graphically by a false color presentation. In this case too, the color presentation of the measurement results can lead to improved operation by a user.

A distance sensor may be provided in order to ensure that the locating appliance is lying flat on a measurement area. The measurement area is usually an essentially planar area in the region of the locating appliance, for example a wall, particularly a lightweight wall, a ceiling or a floor. A side of the locating appliance that faces the measurement area is usually also planar, and the distance sensor monitors an at least approximate degree of parallelism between the measurement area and the locating appliance. If the locating appliance is not lying on the measurement area in sufficiently planar fashion, the predetermined ratio can be adapted in line with the deviation from the degree of parallelism, in order to keep the measurement result constant. In addition or alternatively, a warning can be output to the user of the locating appliance.

The locating appliance may also comprise a displacement sensor for sensing a displacement of the locating appliance relative to the article, the locating appliance being designed to associate a measurement result from the push-pull measurement bridge with a displacement position. This means that a user can be provided with the capability of sweeping over a measurement region with the locating appliance and thereby recording a large number of measurement results which can then be presented graphically, for example. In one embodiment, an image detail and/or a magnification level from/for the graphical presentation can be selected and presented on the visual display device of the locating appliance.

The locating appliance may comprise a further push-pull measurement bridge having a further first and a further second electromagnetic device, wherein the first electromagnetic device of the push-pull measurement bridge produces an electromagnetic field with a negligibly small magnetic component, while the first electromagnetic device of the further push-pull measurement bridge produces an electromagnetic field with a negligibly small electrical component, in order to sense the article on the basis of an electrical field and a magnetic field simultaneously.

BRIEF DESCRIPTION OF THE DRAWINGS

The text below describes the disclosure in more detail with reference to the appended figures, in which.

DETAILED DESCRIPTION

Figure 1:
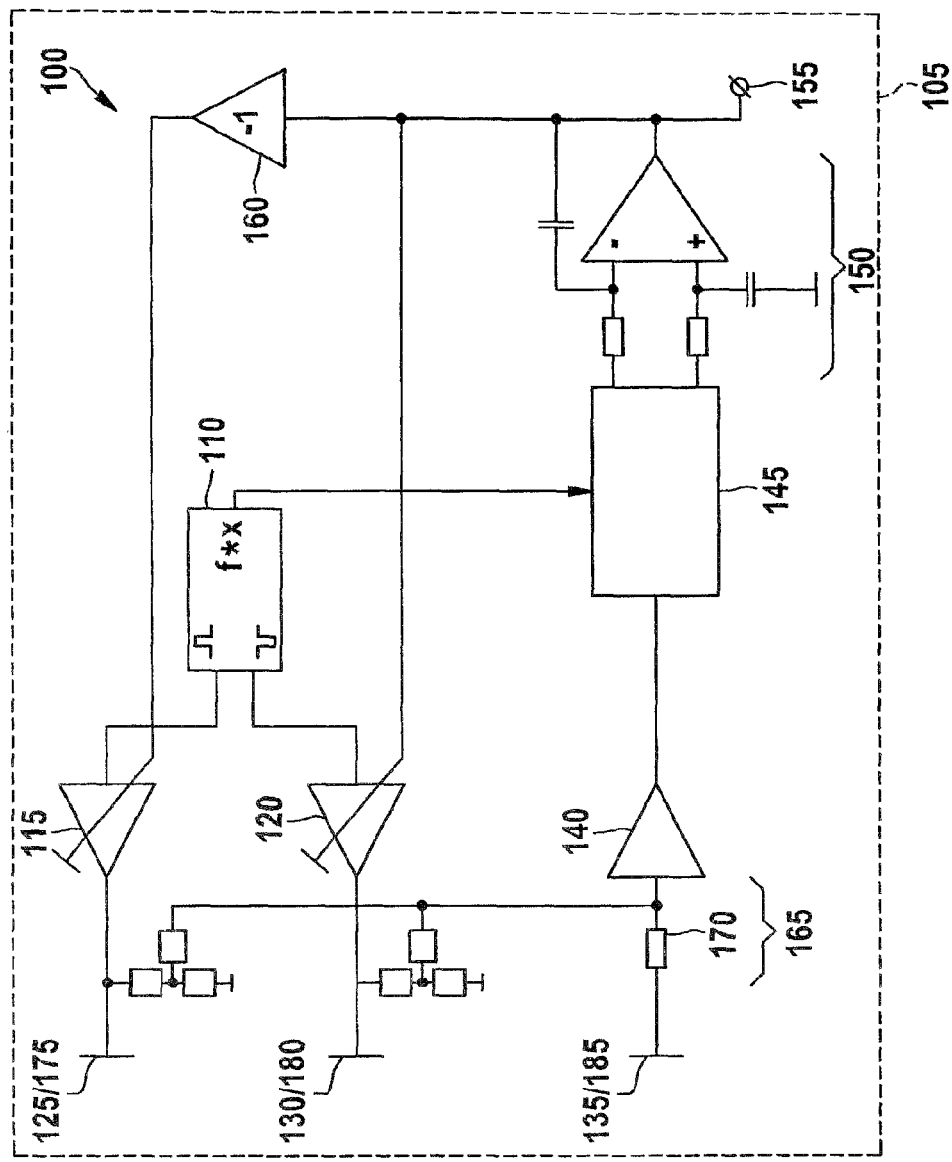
FIG. 1 shows a block diagram of a push-pull measurement bridge.

FIG. 1 shows a block diagram of a push-pull measurement bridge 100. The push-pull measurement bridge 100 is part of a locating appliance 105 for sensing articles, particularly objects that are enclosed in a medium, such as a wall, a ceiling or floor. The locating appliance—see also FIG. 5—is particularly in the form of a hand-held measurement appliance. Depending on the embodiment, the push-pull measurement bridge 100 can be used for sensing a dielectric article, for example made of wood, or for sensing a metallic article, for example made of steel. The text below first of all describes the embodiment which can be used to sense a dielectric article.

A clock generator 110 has two outputs at which it provides periodic alternating signals having a phase shift, preferably a 180° phase shift. The alternating signals may comprise square-wave, triangular-waveform or sinusoidal signals, in particular. The outputs of the clock generator are connected to a first controllable amplifier 115 and a second controllable amplifier 120, respectively. Each of the controllable amplifiers 115, 120 has a control input which it uses to receive a signal which controls a gain factor of the controllable amplifier 115, 120.

Figure 6:
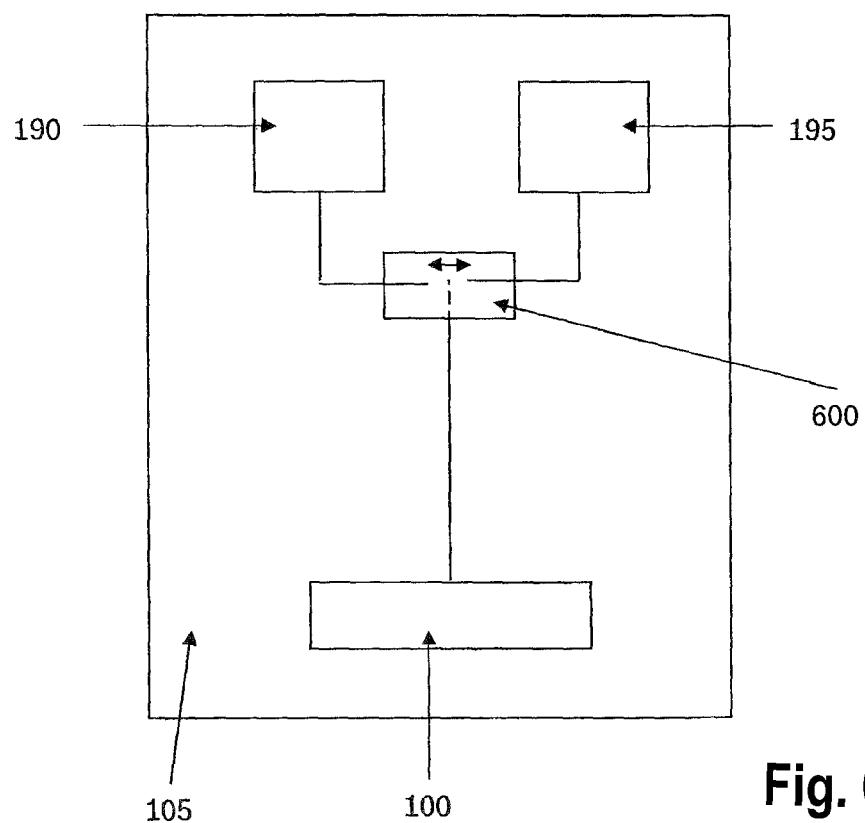
FIG. 6 shows a schematic illustration of the locating appliance according to the disclosure, with an exemplary sensor system.

The signals from the push-pull measurement bridge are passed to a first electrical device 190 and/or a second electrical device 195 by means of a changeover switch 600 (see FIG. 6).

For the purposes of description, the first electronic device and the second electronic device are shown as just one unit in FIG. 1, but are provided with different reference symbols for the first and second devices.

The text below first of all describes the second electronic device with its electrodes.

An output of the first controllable amplifier 115 is connected to a first transmission electrode 125, and an output of the second controllable amplifier 120 is connected to a second transmission electrode 130 of the second electronic unit 195. A reception electrode 135 is used as a potential probe and is connected to an input amplifier 140; a compensating network 165 that is shown in the region of the electrodes 125-135 is not considered at first and an impedance 170 is dispensed with. This arrangement is referred to as the second electrical unit within the context of this application. The second electrical unit is, like the first electrical unit that is yet to be described, actuated—by the push-pull 100—measurement bridge.

The input amplifier 140 is shown with a constant gain factor; in other embodiments, however, a gain factor for the input amplifier 140 may also be controllable. By way of example, this allows a spatial resolution and/or sensitivity of the push-pull measurement bridge 100 to be influenceable and, by way of example, to be controllable on the basis of a measurement signal on the input amplifier 140.

The output of the input amplifier 140 is connected to a synchronous demodulator 145. The synchronous demodulator 145 is also connected to the clock generator 110 and receives from the latter a clock signal which indicates the phase of the signals provided at the outputs of the clock generator 110. In a simple embodiment, in which the signals provided by the clock generator 110 are symmetrical square-wave signals, one of the output signals routed to the controllable amplifiers 115, 120 can be used as a clock signal. The synchronous demodulator 145 essentially takes the clock signal provided by the clock generator 110 as a basis for connecting the measurement signal received from the input amplifier 140 alternately to its upper or lower output.

The two outputs of the synchronous demodulator 145 are connected to an integrator (integrating comparator) 150, which in this case is shown as an operational amplifier connected up to two resistors and two capacitors. Other embodiments are likewise possible, for example as an active low-pass filter. A digital implementation in the connection to the synchronous demodulator 145 is also conceivable, in the case of which the signal at the outputs of the synchronous demodulator 145 is subjected to analog-to-digital conversion at one or more times within a half-cycle and is then compared with the corresponding value for the next half-cycle. The difference is integrated and, by way of example, converted back to an analog signal and used for controlling the amplifiers 115, 120. While the synchronous demodulator 145 provides the measurement signal received from the input amplifier 140 at the lower of its outputs, the integrator 150 integrates this signal over time and provides the result at its output. While the synchronous demodulator 145 provides the measurement signal received from the input amplifier 140 at its upper output, this signal is integrated by the integrator 150 in inverted form over time and the result is provided at the output of the integrator 150. The voltage at the output of the integrator 150 is the integral of the difference between the low-pass-filtered outputs of the synchronous demodulator 145.

If the capacitance at the first transmission electrode 125 is of precisely the same magnitude as the capacitance at the second transmission electrode 130, the signals provided at the outputs of the synchronous demodulator 145 are of equal magnitude on average over time, and the output of the integrator 150 provides a signal which is virtually zero (ground). If the capacitances are of unequal magnitude, however, for example because a dielectric article is arranged in the region of only one of the transmission electrodes 125, 130, then the signals provided at the outputs of the synchronous demodulator 145 are no longer equal on average, and the output of the integrator 150 provides a positive or a negative signal. The arithmetic sign and the absolute value of the signal indicate the ratio of the capacitances, with a signal of zero corresponding to a ratio of one.

The signal provided by the integrator 150 is provided for an evaluation and output device—not shown—in the beam finder 105 via a connection 155. By way of example, the evaluation device can perform a comparison with a threshold value, as a result of which a user of the locating appliance 105 is provided with a visual and/or audible output when the signal provided by the integrator 150 exceeds a predetermined threshold. In this case, the entire signal or an absolute value of the signal can be compared with the threshold value.

The signal provided by the integrator 150 is also used for controlling the gain factors of the controllable amplifiers 115 and 120, the second controllable amplifier 120 being connected directly to the output of the integrator 150, and the first controllable amplifier 115 being connected to the output of the integrator 150 by means of an inverter 160. The inverter 160 prompts inversion of the signal with which it is provided such that the gain factor of the first controllable amplifier 115 increases on the basis of the output signal from the integrator 150 by the amount by which the gain factor of the second controllable amplifier 120 decreases, or vice versa. It is also conceivable for only the gain factor of one of the controllable amplifiers 115, 120 to be controlled, while the gain factor of the second controllable amplifier 120, 115 is kept at a fixed value.

The gain factors of the controllable amplifiers 115 and 120 increase or decrease until an AC voltage component which is in sync with the alternating voltage applied to the transmission electrodes 125 and 130 and which is applied to the reception electrode is minimized in terms of absolute value.

The push-pull measurement bridge 100 is a control loop which is set up to maintain a predetermined ratio at the transmission electrodes 125 and 130. The predetermined ratio is prescribed by the setup and arrangement of the transmission electrodes 125 and 130 relative to one another and relative to the reception electrode 135. A variable ratio is obtained from the capacitances formed on the transmission electrodes 125 and 130 relative to the reception electrode 135. The signal provided by the integrator 150 is a control signal for compensating for an asymmetrical influence on the capacitances, for example by the dielectric article. In other embodiments, the variable ratio at the electrodes is determined on the basis of currents or voltages at the electrodes.

At each of the transmission electrodes 125, 130, the compensating network 165 comprises a voltage divider consisting of two impedances. The divided voltages are routed to the input amplifier 140 by means of a respective further impedance. The reception electrode 135 is routed to the input amplifier 140 not directly but rather by means of the impedance 170. Through an appropriate choice of the individual cited impedances, it is possible to alter the impedances that are effective at the outputs of the controllable amplifiers 115, 120. This makes it possible to compensate for an asymmetrical arrangement of the electrodes 125-135, for example.

In a further embodiment, in comparison with the illustration in FIG. 1, the compensating network 165 dispenses with the impedances in the region of the first transmission electrode 125 and also with the second transmission electrode 130. Hence, the alternating voltages from the controllable amplifiers 115, 120 are balanced out between a capacitance that is present at the first (single) transmission electrode 125 and a reference capacitance that is formed by the compensating network 165. The reference capacitance is invariant toward a dielectric article. Measurements now require only the first transmission electrode 125 and the reception electrode 135.

A converse embodiment, in which, in comparison with the illustration in FIG. 1, the compensating network 165 dispenses with the impedances in the region of the second transmission electrode 130 and also with the first transmission electrode 125, is likewise possible.

The provision of switches allows the push-pull measurement bridge 100 according to the described embodiments to be operated in a three-electrode measurement mode by using two transmission electrodes 125 and 130, a first two-electrode measurement mode by using the first transmission electrode 125 and the reception electrode 135, and also a second two-electrode measurement mode by using the second transmission electrode 130 and the reception electrode 135. Changeover between the various measurement modes can be effective cyclically or may be controlled by a user.

Whereas, in the two-electrode measurement mode, a voltage applied to the connection 155 of the push-pull measurement bridge 100 in FIG. 1 is highest when the dielectric article is closest to the reception electrode 135, the absolute value of this voltage in the three-electrode measurement mode is at a maximum when the dielectric article is closest to one of the transmission electrodes 125 and 130, with the arithmetic sign of the voltage indicating the respectively closest transmission electrode. When the article is moved past the electrodes, the three-electrode measurement mode thus provides a signal having a change of arithmetic sign and the two-electrode measurement mode provides a signal having a local maximum at the moment of passage.

Furthermore, the push-pull measurement bridge 100 can also be used to sense a metallic article. To this end, a changeover switch 600 (in this regard see FIG. 6) is used to pass the voltage signals from the push-pull measurement bridge 100 to an inductive electrical device which, in the context of this application, is referred to as the first electrical unit 190.

The push-pull measurement bridge 100 uses the changeover switch 600 to actuate the first and/or the second electrical unit. Instead of the electrodes of the second electrical E, coils are essentially used in the first electrical unit. (cf. description and explanation below).

To describe and explain the actuation of the first electrical—i.e. the inductive—device 190, reference is again made to FIG. 1. In this case, the transmission electrodes of the second electrical unit can notionally be replaced by transmission coils.

In particular, the following is true for the first electrical device: the first transmission electrode 125 can be replaced by a first transmission coil 175 in this case and a second transmission electrode 130 can be replaced by a second transmission coil 180. The reception electrode 135 is replaced by a single reception coil 185 or by a system of reception coils, preferably two reception coils that are connected in series with one another. Preferably, at least one of the coils is in the form of a conductor structure on a circuit board ("printed coils"). In a further embodiment, the reception electrode 135 can be replaced by a single magnetoresistive magnetic field sensor, preferably a Hall sensor, or by a system of magnetoresistive sensors, preferably two magnetoresistive sensors that are connected in series with one another. In a further embodiment, instead of the reception electrode 135, magnetoresistive magnetic field gradient sensors can also be used.

The text below explains the push-pull measurement bridge 100 by using the reception coil 185. The use of a system of reception coils 185 or of magnetoresistive magnetic field sensors or magnetic field gradient sensors is effected in a similar manner.

The transmission coils 175, 180 produce superimposed magnetic fields having periodically changing amplitudes and phases. Preferably, both transmission coils 175, 180 use each half-cycle of their supply voltage to produce magnetic fields having the same amplitude and parallel orientation of the main field directions. The arithmetic sign of the magnetic fields alternates from half-cycle to half-cycle. To this end, the transmission coils 175 and 180 are wound in opposite senses and the free ends of said coils are each connected to ground. The supply of voltage by the controllable amplifiers 115, 120 is effected with voltages that are opposed in respect of ground. Alternatively, the transmission coils 175 and 180 use a half-cycle to produce magnetic fields having a different amplitude and parallel or antiparallel orientation of the main field direction. The amplitude and the arithmetic sign of the magnetic field produced by the transmission coil 175 in a half-cycle correspond to the amplitude and arithmetic sign respectively of the magnetic field produced by the transmission coil 180 in the preceding or subsequent half-cycle. To this end, the winding senses of the transmission coils 175, 180 and also the supply voltages for the transmission coils 175, 180 with reference to ground need to be adapted accordingly.

The reception coil 185 is arranged in the region of the transmission coils 175 and 180 such that it is exposed to the superimposed magnetic field from both transmission coils 175 and 180. Preferably, the arrangement of the coils 175 to 185 is chosen such that the voltage induced in the reception coil 185 by the magnetic fields from the transmission coils 175 and 180 is zero, but at least constant, when the two controllable amplifiers 115 and 120 have the same gain factors.

When only one reception coil 185 is used, the transmission coils 175 and 180 may be arranged coaxially in two parallel planes, for example, and the reception coil 185 is arranged in a third parallel plane which is at the same distance from each of the first two planes. When a system comprising two interconnected reception coils 185 is used, the transmission coils 175 and 180 may be arranged in two parallel planes. The two interconnected reception coils 185 may each be arranged in one of the two parallel planes, preferably such that the orientation and position of each of the transmission coils 175, 180 corresponds to the orientation and position of each of the reception coils 185. The winding sense and interconnections of the reception coils 185 are determined from the condition that the voltage induced across the system of reception coils 185 is zero when the two controllable amplifiers 115 and 120 have the same gain factors. If the two transmission coils 175, 180 use each half-cycle to produce magnetic fields having the same amplitude and parallel orientation of the main field direction, and the arithmetic sign of the magnetic fields alternates from half-cycle to half-cycle, this condition is met, for example, when the two reception coils 185 are connected in series and are wound in opposite senses. If the two reception coils 185 are operated in an antiserial series circuit, the reception coils 185 must be wound in the same sense. For the further cases—described above—of alternative magnetic fields produced by the transmission coils and superimposed, the result is analogous combinations of the interconnection of the reception coils 185 and the relative orientation of the winding sense of the reception coils 185. The predetermined ratio for the transmission coils 175 and 180 is 1 in this case.

In respect of the omission of coils 180, 185 and the use of the compensating network 165 and the impedance 170, the above explanations regarding the embodiment for determining a dielectric article apply in corresponding fashion.

The transmission coils 175 and 180 are at positions which are at least slightly axially or laterally offset from one another, which means that a metallic article generally adopts different distances from the transmission coils 175 and 180. It is possible to prevent the article from being located in a plane between the transmission coils 175 and 180, in which plane the article is at the same distance from the transmission coils 175 and 180 in the case of axially offset transmission coils 175, 180, by virtue of the arrangement of the transmission coils 175 and 180 in the locating appliance 105. The asymmetrical position of the article relative to the transmission coils 175 and 180 means that the article is influenced by the magnetic fields from the transmission coils 175 and 180 in different ways. Accordingly, the magnetic fields are also influenced by the metallic article in different ways, as a result of which the voltage induced by the superimposed magnetic fields in the reception coil 185 is no longer zero. The push-pull measurement bridge 100 compensates for this asymmetry by virtue—as explained above—of one of the amplifiers 115 and 120 being actuated to produce a higher gain factor than the other of the amplifiers 115, 120 until the voltage induced by the superimposed magnetic fields in the reception coil 185 has reached the value zero again. The variable ratio between the transmission coils 175 and 180 then no longer corresponds to 1 and the connection 155 has a voltage applied to it which is not equal to zero. Comparison of the voltage applied to the connection 155 with the predetermined value zero (corresponding to the predetermined ratio one) allows the metallic article to be sensed.

FIG. 6 once again shows the schematic design of the locating appliance according to the disclosure in the preferred embodiment. The appliance has at least one push-pull measurement bridge 100—as described. Furthermore, a first electrical device 190 and a second electrical device 195 are provided which can have the push-pull measurement bridge 100 connected to them by means of a changeover switch 600. It is thus possible to use (only) one push-pull measurement bridge to operate two electrical devices, i.e. two sensors.

Figure 2:
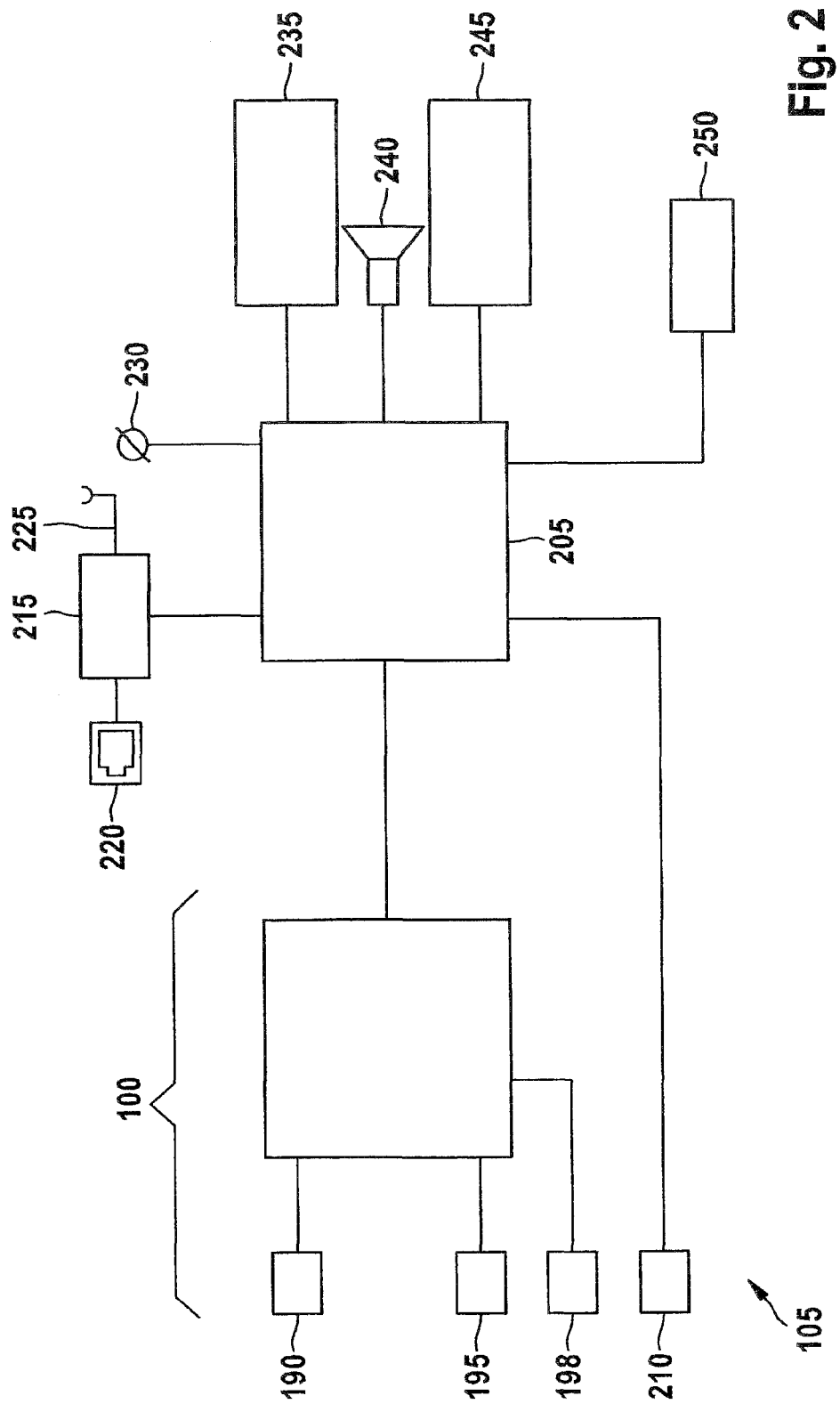
FIG. 2 shows a locating appliance having the push-pull measurement bridge from FIG. 1.

FIG. 2 shows a schematic illustration of the locating appliance 105 having the push-pull measurement bridge 100 from FIG. 1. In this case, the push-pull bridge 100 is advantageously integrated in an IC, for example an ASIC (application-specific IC).

The locating appliance 105 comprises a processing device 205 which is connected to the push-pull measurement bridge 100. In addition, the processing device 205 is connected to a voltage sensor 210 and a power controller 215, which for its part is connected to a battery 220, for example a rechargeable battery and a charging socket 225. Furthermore, the processing device 205 is connected to a data interface 230, a visual output device 235, an audible output device 240, an input device 245 and a position sensor 250.

In the embodiment shown, the push-pull measurement bridge 100 is of separate design from the processing device 205. In another embodiment, elements of the push-pull measurement bridge 100 may also be formed by the processing device 205. In particular, the changeover switch between the first electrical device and the second electrical device may be part of the processing device 205. The processing device 205 is preferably an ordinary digital microcomputer having an operating clock generator and program and data memories. For the conversion between digital signals of the processing device 205 and analog signals in the push-pull measurement bridge 100, one or more digital/analog converters (DAC) and at least one analog/digital converter (ADC) may be provided. In particular, the processing device 205 may implement the clock generator 110, the controllable amplifiers 115 and 120, the synchronous demodulator 145, the integrator 150 and/or the inverter 160.

The signal from the push-pull measurement bridge 105, which signal is provided at the connection 155 and indicates the variable ratio for the first and second electromagnetic devices 190 and 195, can also be evaluated by means of the processing device 205. This includes the comparison of the signal with a predetermined value and the determination of whether the difference between the signal and the predetermined value exceeds a predetermined amount. In another embodiment, the functionalities described may also be implemented by discrete components, for example by analog electronic circuits or in the form of a user-specific IC (ASIC).

The voltage sensor 210 is a known sensor which senses an electromagnetic field which is generated by a current-carrying or voltage-carrying conductor. In one embodiment, exclusively electromagnetic alternating fields in a predetermined frequency range are detected by the voltage sensor 210, for example in the frequency range above 20 Hz, preferably in a range from approximately 45 to 65 Hz. With further preference, the voltage sensor 210 determines the electromagnetic field by means of the electrical voltage that is applied to a measurement electrode of the voltage sensor 210 on the basis of the electrical field.

In addition to the voltage sensor 210, further auxiliary sensors—not shown—for improving a measurement result from the push-pull measurement bridge 100 may be connected to the processing device 210. By way of example, these include a sensor which determines whether the electromagnetic devices 190 to 198 are oriented relative to a measurement area as required, particularly whether distances between the measurement area and the electromagnetic devices 190 to 198 are of equal magnitude. This makes it possible to prevent the locating appliance 105 from being tilted relative to the measurement area. The measurement area is usually the surface of a body which holds the article to be sensed. The body may be a wall and the article may be concealed therein.

The power controller 215 supplies the locating appliance 105 with voltages which are required for operation. Usually, the electrical power required for this purpose is taken from the battery 220, for example a rechargeable battery. To charge the battery 220, the power controller 215 can be supplied with electrical power via the charging socket 225, with the power controller 215 controlling and monitoring the charging of the battery 220. It is likewise possible for the locating appliance 105 to be operated on the basis of electrical power which is supplied exclusively via the charging socket 225. The charging socket 225 is usually a low-voltage connector, the counterpart of which is connected to a power supply unit. In one embodiment, a charging station may be provided, into which the locating appliance 105 is placed, with the charging socket 225 being electrically connected to the power supply unit, so that the battery 220 can be charged. In a further embodiment, the power supply unit may also be held in the locating appliance 105 and the charging socket 225 can be connected to the usual power supply system.

Parts of the logic for supplying the locating appliance 105 with electrical power and for controlling the charging process of the battery 220 may be implemented by the processing device 205. In addition, the processing device 205 can influence the power controller 215, for example in the form of automatic switch-off of the locating appliance 105 after a predetermined time in which the locating appliance 105 has not been used, or in the form of a check on a present charge state of the battery 220.

The data interface 230 can be used by the processing device 205 to interchange information with an external appliance. Such information may relate to measurement results which have been collected or are held in a memory in the processing device 205. The data interface 230 and the charging socket 225 may be in a form in which they are integrated with one another. Preferably, the data interface 230 is a digital serial data interface, particularly a USB interface.

In a first embodiment, the visual output device 235 comprises a number of light-emitting diodes for visually displaying a measurement result from the push-pull measurement bridge 100. Further light-emitting diodes for presenting internal states of the locating appliance 105 may likewise be included, for example for indicating a charge state of the battery.

In a second embodiment, which can be combined with the first embodiment, however, the visual display device 235 comprises a graphical display, for example a liquid-crystal display (LCD). The LCD may comprise a backlight, for example using LEDs or OLEDs, and may comprise a region with a dot matrix which can be used to selectively display individual points. Both the LCD and the backlight or the light-emitting diodes in the first exemplary embodiment are able to support a plurality of output colors. In one preferred embodiment, the visual output device is designed such that it is possible for the locating appliance 105 to be operated either in a bright environment or in a dark environment. To this end, a luminous brightness of the LEDs or of the backlight in the LCD can be adapted to the light conditions in the environment.

The audible output device 240 may comprise a loudspeaker or a piezo transducer. The presentation of a measurement result from the push-pull measurement bridge 100 can be output visually, audibly or in a combination of visually and audibly by means of the visual output device 235 and the audible output device 240. By way of example, a position of a sensed article can be displayed on the visual output device 235 while a characteristic sound from the audible output device 240 indicates a metallic property of the article. A color of the visually presented article can symbolize a distance, particularly a depth of the article. Associations between the color and sound and properties of the article (metallic, dielectric, voltage-carrying) may be alterable, in one embodiment also by a user of the locating appliance 105.

The input device 245 can be used by the user to operate the locating appliance 105. The input device 245 may comprise a number of keys which may be combined in a keypad. In one embodiment, the input device 245 merely comprises a single key, with complete operation of the locating appliance 105 being ensured by means of this one key. The input device 245 may be partially or completely backlit. The backlight may be coupled to a backlight of the visual output device 235. Alternatively or in addition, the backlight may be user-controlled. In addition, the input device 245 may comprise further input means, particularly a rotary or slide control. Such a control may be sampled in analog or digital fashion and, in particular, used for changing a parameter of the locating appliance 105 smoothly or in fine steps. Such a control can be used to set a sensitivity for the push-pull measurement bridge 100. Furthermore, the input device 245 may be designed to be wholly or partially integrated with the visual output device 235 in the form of a touch-sensitive screen "touch screen".

The position sensor 250 is used to determine a position for the locating appliance 105 relative to the measurement area by sensing a displacement of the locating appliance 105 relative to the measurement area. The sensing can take place in one dimension or in two dimensions. To this end, it is possible to use an acceleration sensor, for example, preferably a micromechanical acceleration sensor. Alternatively, a wheel may be arranged in the region between the locating appliance 105 and the measurement area, with a rotation of the wheel being converted into a displacement by the processing device 205. In the two-dimensional case, a mechanism similar to that in a computer mouse can be used by virtue of a trackball being held between the locating appliance 105 and the measurement area, and a displacement of the locating appliance 105 being sampled in two dimensions on the basis of a movement of the trackball. In yet a further embodiment, optical sampling in a similar manner to in an optical computer mouse can be performed, with the position sensor 250 comprising a camera which is directed onto the measurement area, and the position sensor 250 converting a displacement of the image taken by the camera into a displacement of the locating appliance 105 relative to the measurement area. The conversion can also be performed by the processing device 205. A light source, for example in the form of one or more light-emitting diodes, may be arranged in the region of the camera.

Besides the one push-pull measurement bridge 100 shown, further push-pull measurement bridges 100 may also be included in the locating appliance 105 and connected to the processing device 205.

In addition, various electromagnetic devices 190 to 198 may, under the control of the processing device 205, be able to be connected to the one or more push-pull measurement bridges 100, so that measurements can be performed by means of electromagnetic devices 190 to 198 which are of different design or at different positions.

Figure 3A:
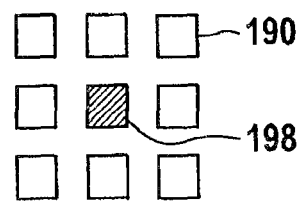
FIG. 3A shows an electromagnetic device in the push-pull measurement bridge from FIG. 1.
Figure 3B:
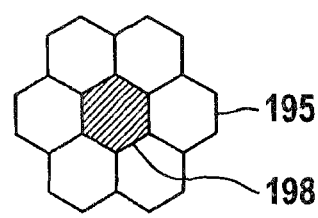
FIG. 3B shows another electromagnetic device in the push-pull measurement bridge from FIG. 1.
Figure 3C:
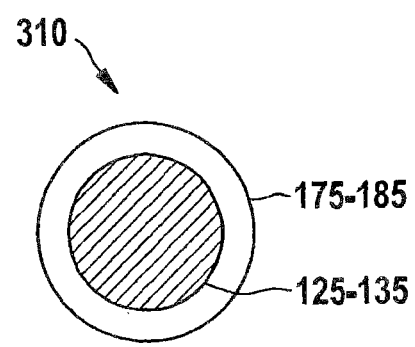
FIG. 3C shows yet another electromagnetic device in the push-pull measurement bridge from FIG. 1.

FIGS. 3A-3C show various arrangements of the electromagnetic devices 190 to 198 for a push-pull measurement bridge 100 from FIG. 1. FIG. 3A shows a matrix-like arrangement. The third electromagnetic element 198 forms the central element of a 3×3 matrix, the remaining elements of which are formed by first and second electromagnetic devices 190, 195. In respect of the third electromagnetic element 198, a first electromagnetic element 190 and a second electromagnetic element 195 are respectively located opposite one another.

In chronological order, various pairs of first and second electromagnetic devices 190, 195 which are opposite one another are connected to the push-pull measurement bridge 100 by means of the changeover switch, so that it is possible to determine, along a line connecting the opposite devices 190, 195, on which side of the third electromagnetic device 198 the article is arranged. This allows determination of the position of the article relative to the third electromagnetic device in a plurality of directions for the plane of the electromagnetic devices 190 to 198.

FIG. 3B shows a honeycomb-like arrangement of electromagnetic devices 190 to 198. In this case, the third electromagnetic device 198 has six instead of eight adjacent electromagnetic devices 190, 195. Particularly when the electromagnetic devices 190, 195 comprise coils, the embodiment shown in FIG. 3B may be advantageous, since the coils can be brought close to the honeycomb shape in a better way than they can to the rectangular shape in FIG. 3A. It is thus possible to have an increased area packing density for the electromagnetic devices 190 to 198 in a honeycomb-shaped arrangement.

The arrangements shown in FIGS. 3A and 3B may be continued in any directions in the plane of the drawing. This makes it possible to support any desired size of arrangement of electromagnetic devices 190 to 198 in principle. If a plurality of push-pull measurement bridges 100 are provided in the locating appliance 105, it is also possible for a plurality of measurements to be performed simultaneously, it being necessary to ensure a sufficient distance between active electromagnetic devices 190 to 198 in order to avoid reciprocal influencing. The electromagnetic devices 190 to 198 involved in a measurement do not have to adjoin one another but rather may be separated from one another by further, preferably not interconnected electromagnetic devices 190 to 198.

In a two-electrode measurement mode of the first electrical device (cf. above with reference to FIG. 1), the arrangements shown in FIGS. 3A and 3B can be interconnected as appropriate.

FIG. 3C shows an exemplary embodiment of a combined measuring element 310 for the first and second electrical units. The combined measuring element 310 comprises a disk-shaped electrode 125 to 135 which is enclosed by a round coil 175 to 185. Centers of the electrode 125 to 135 and of the coil 175 to 185 coincide in order to be able to sense articles having different properties (metallic, dielectric) relative to the same position.

The measuring element 310 can be used in the arrangements shown in FIGS. 3A and 3B. The voltage sensor 210 may be in a form integrated with one of the electromagnetic devices 190 to 198. The voltage sensor may also be arranged on a side of the electromagnetic devices 190 to 198 which is remote from the measurement area.

Figure 4:
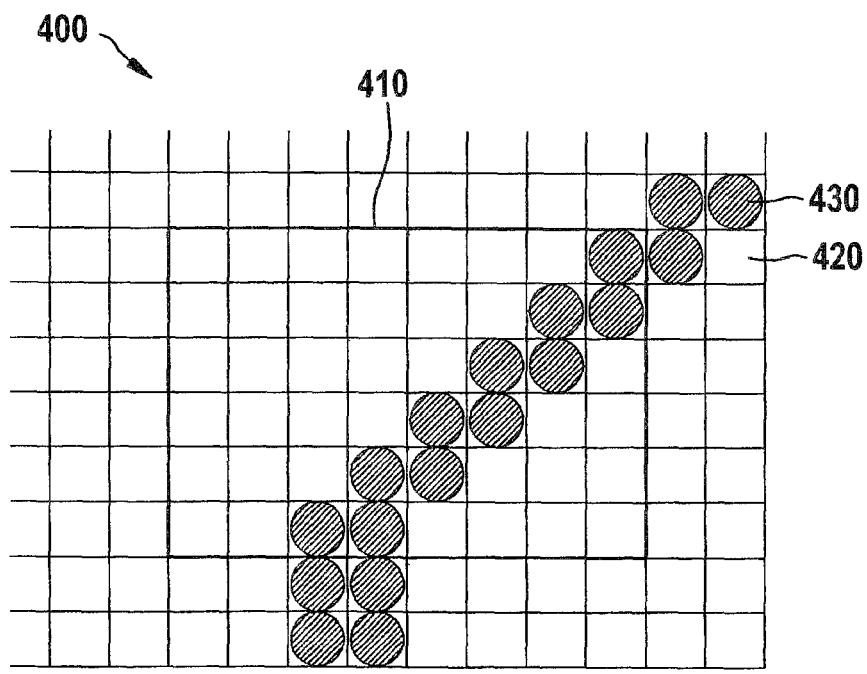
FIG. 4 shows a visual display of a graphical display on the locating appliance from FIG. 2.

FIG. 4 shows a visual display of a graphical display on the locating appliance 105 from FIG. 2. A graphical output 410 is divided into a number of display regions 420, 430 in matrix fashion. The display regions 420 are of light color and the display regions 430 are of dark color. The dark-colored display regions 430 represent positions at which the article has been sensed. Instead of a division into dark and light, it is also possible to use a grayscale or false-color presentation, with the presented grayscale or color signaling a distance of the article or a property of the article (metallic, dielectric, voltage-carrying). Each of the display regions 420, 430 corresponds to a third electromagnetic device 198 in a matrix-like arrangement as in FIG. 3A.

The output 410 provides a visual impression of a magnitude and position of the article to be sensed. FIG. 4 contains further display regions 420, 430 outside the output 410 in symbol form. These represent measurement results which have been provided and stored by means of the locating appliance 105 from other positions. By displacing the measuring appliance 105 on the measurement area, it is possible to displace the detail about these stored measured values which is shown on the output 410. This can involve the performance of various graphical processing operations on the stored measured values. By way of example, the measured values can each represent the variable ratio, and it is possible for a comparison with the predetermined ratio and a corresponding presentation on the output 410 in light or dark each to be implemented "freshly" for the display regions 420, 430 in the region of the output 410. In this case, the predetermined ratio may have been adapted in line with input by a user. This makes it a simple matter for a user to display a contour of the article on the output 410 by displacing the locating appliance 105 relative to the measurement area and adjusting the relevant presentation parameters for the output 410. The parameter can be adapted particularly by means of a shift or rotary control.

In a further embodiment, the grayscales and colors of the display regions 420, 430 can be replaced by a bar presentation, with the length of a bar being able to correspond to a value of the variable ratio or the deviation thereof from the predetermined ratio. This type of presentation is particularly suitable for when the locating appliance 105 can be displaced in only one dimension relative to the measurement area. Stored display regions 420, 430 which go beyond the output 410 then consist only in an areal direction, that is to say either horizontally or vertically. If the locating appliance 105 can be displaced vertically, the bars are preferably shown horizontally, and vice versa.

In further embodiments, stored display regions within the display can be enlarged in the manner of a magnifying glass, for example, so that a group of adjoining display regions 420, 430 visually display only one measured value.

Figure 5:
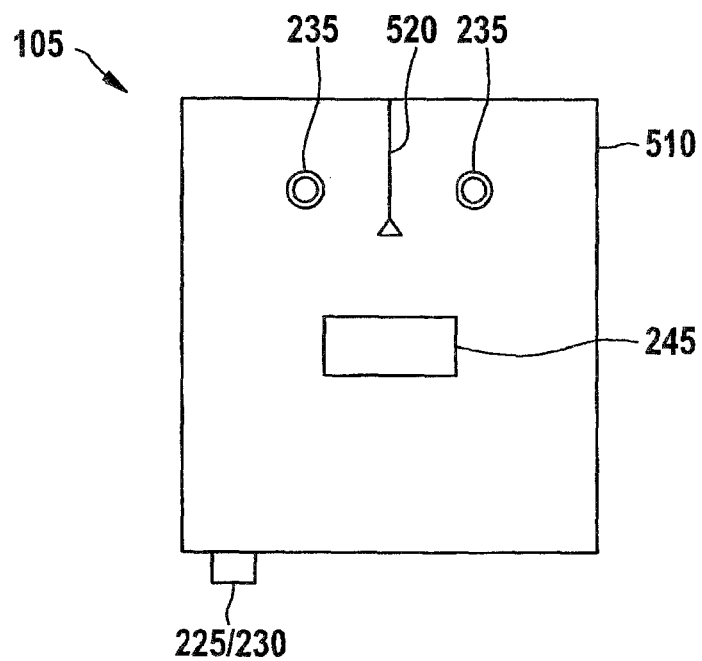
FIG. 5 shows a view of an exemplary locating appliance as shown in FIG. 3.

FIG. 5 shows a view of an exemplary locating appliance 105. The locating appliance 105 comprises an input device and a visual output device in the form of a display.

The locating appliance 105 is held in a housing 510. A lower region of the housing contains a grip, which may also be formed on the top of the appliance, however. The locating appliance 105 may be sealed according to IP 54 Standard.

The presentation of the measurement results, i.e. the signaling of the detection of objects that have been found, can be visually displayed by means of a segment or dot-matrix display, for example.

In a further embodiment, which can be combined with the other embodiment, however, the visual display device 235 comprises a graphical display, for example a liquid crystal display (LCD). The LCD may comprise a backlight, for example using LEDs or OLEDs, and may comprise a region with a dot matrix which can be used to selectively display individual points. Both the LCD and the backlight or the light-emitting diodes in the first exemplary embodiment are able to support a plurality of output colors. In one preferred embodiment, the visual output device is designed such that it is possible to operate the locating appliance 105 either in a bright environment or in a dark environment. To this end, a luminous brightness of the LEDs or of the backlight of the LCD can be adapted to the light conditions in the environment.

This may also be a display with a touch function.

The following functions may advantageously be covered individually or in combination in the case of the output unit of the appliance according to the disclosure:
- the type of the object (ferromagnetic/nonferromagnetic/nonmetallic) can be represented by a symbol
- a zoom indicator, for example also optionally selectable by the user, may be provided, in order to increase the visually displayed sensitivity
- in this context, particularly a zoom indicator with centering, e.g. with a bar graph, is advantageous
- a depth indicator for the object found is advantageous
- a signal strength indicator, for example with a bar graph, may be implemented with the display of the appliance according to the disclosure
- a backlight for the output unit can improve legibility under poor light conditions. In this case, the backlight of the locating appliance according to the disclosure may be designed with LEDs/OLEDs for example.

The hand-held locating appliance furthermore has an input unit in the form of a key or keypad. The following variants, inter alia, may be covered in this context: single-knob operation (simultaneous measurement using different sensors), manual mode preselection for optimizing the sensor performance, on/off switch, backlit keypad, and sensitivity selection.

In the exemplary embodiment in FIG. 5, a momentary-contact switch 245, for example, controls all the functions of the locating appliance 105. In the simplest case, the momentary-contact switch 245 is used merely to control switching-on and switching-off of the locating appliance 105. Longer or shorter, single and multiple keystrokes on the momentary-contact switch 245 also allow the control of further functions of the locating appliance 105, for example changeover of a sensitivity, calibration or output of the charge state of the battery 220.

Alternative embodiments envisage a keypad having a plurality of control keys, for example including selection keys for whether the first or second electrical unit is intended to be used for measurement.

The appliance according to the disclosure also has an internal power supply, which may be formed by batteries or else by rechargeable batteries.

The storage batteries may be permanently integrated in the appliance or else can be removed from the appliance for charging purposes.

Advantageously, the charging electronics are integrated in the appliance. External power is then supplied via an interface to the housing of the appliance, such as a low-voltage connector or else a USB socket.

Advantageously, a USB socket may be present as a combined data interface 230 and charging socket 225, as shown in FIG. 6.

Alternatively or in addition, the output unit can also allow the presentation of measurement results by means of LEDs however. In this case, the thresholds for the individual LEDs can be generated by means of a controller integrated in the appliance or by means of analog electronics. By way of example, this may involve the use of colored LEDs to visually display the centering or else to indicate an AC line.

The light-emitting diodes 235 in the exemplary embodiment in FIG. 5 indicate a position of the article to the left or right of a center marker 520 on the housing 510. Electromagnetic devices 190 to 198—which cannot be seen—are arranged centrally relative to the center marker 520. If both light-emitting diodes 235 light with the same brightness, the article is located evenly beneath the center marker 520. In order to find an edge of the article, the locating appliance 105 needs to be displaced until the light-emitting diodes 235 light with different brightnesses. Ideally, the edge of the article is directly beneath the center marker 520 when one light-emitting diode 235 is off and the other light-emitting diode 235 has reached maximum brightness.

Alternatively or in addition to the light-emitting diodes 235, the visual display device 235 may comprise a graphical display, for example a liquid crystal display (LCD). The LCD may comprise a backlight, for example using LEDs or OLEDs, and may comprise a region with a dot matrix which can be used to selectively display individual points. Both the LCD and the backlight or the light-emitting diodes in the first exemplary embodiment are able to support a plurality of output colors. In one preferred embodiment, the visual output device is designed such that it is possible to operate the locating appliance 105 either in a bright environment or in a dark environment. To this end, a luminous brightness of the LEDs or of the backlight of the LCD can be adapted to the light conditions in the environment.

Alternatively or in addition to the visual output unit, the locating appliance according to the disclosure may also have a sound generator. By way of example, this may be a loudspeaker or a piezo transducer which can be used to signal the detection of an AC line, for example. The sound generator can also be operated at various frequencies/rhythms by means of a controller (or similar threshold-generated electronics) on the basis of the signal strength of the measurement system, so as to signal object detection and distinction.

Furthermore, the locating appliance according to the disclosure may have a mechanical or optical displacement sensor. Mechanical displacement sensors (wheels with a light barrier and a segmented disk) or optical displacement sensors (such as optical mouse sensors) or acceleration sensors sense the distance that the hand-held locating appliance is moved over a surface. This information is made available to the signal processing, for example in order to improve the sensor performance or the display. In particular, it is therefore also possible to associate the detection data with specific local positions of the appliance.

The electronics arranged in the housing of the appliance advantageously have at least one controller which can be used to control the measurement method described in the present case and the functions of the appliance, as already explained in part. The controller can control or cover a multiplicity of functions, such as an NMI interface, a charging electronics controller or regulator or else an "auto-off function". Alternatively, the function of the controller, particularly for the housing functions, can also be covered by analog electronics.

What is claimed is:

1. A locating appliance, for detecting objects enclosed in a medium, comprising:
   a housing;
   an output device, provided in or on the housing, wherein the output device is a display;
   a first electrical device, arranged in the housing, and including at least two electromagnetic coils, wherein the first electrical device is configured such that it takes an actuation as a basis for producing an electromagnetic alternating field in a region of an object;
   a second electrical device, arranged in the housing, and including at least two electrodes, wherein the second electrical device is configured such that it takes the actuation as a basis for producing an electrical field in the region of the object;
   an actuating apparatus, arranged in the housing, and including a push-pull measurement bridge configured to actuate the first electrical device and/or the second electrical device, in each case with alternating voltages having a variable ratio; and
   a comparator configured to generate a signal which denotes an object as sensed if a respective ratio of the voltages from the first electrical device and/or the second electrical device differs from a predetermined ratio by more than a prescribeable amount,
   wherein the output device is configured to output a signal indicating the object if the respective ratio of the voltages from the first electrical device and/or the second electrical device differs from a predetermined ratio by more than a prescribeable amount.

2. The locating appliance according to claim 1, wherein the alternating voltages are AC voltages having a phase shift relative to one another.

3. The locating appliance according to claim 2, wherein the alternating voltages are AC voltages having a 180° phase shift.

4. The locating appliance according to claim 1, wherein the actuating apparatus is configured to amplify the alternating voltages in opposite directions relative to one another.

5. The locating appliance according to claim 1, further comprising:
   a device configured to alter the magnitude of the prescribeable amount.

6. The locating appliance according to claim 1, further comprising:
   a changeover switch configured to allow a signal from the push-pull measurement bridge to be connected alternatively to the first electrical device or to the second electrical device.

7. The locating appliance according to claim 1, wherein:
   the actuating apparatus is in the form of an ASIC, and
   the actuating apparatus is arranged in the housing.

8. The locating appliance according to claim 1, wherein the signal indicating the object from the output device indicates what type of article has been sensed.

9. The locating appliance according to claim 1, wherein a distance of the article from the locating appliance corresponds to a change of color in the output device.

10. The locating appliance according to claim 1, further comprising:
    a distance sensor for ensuring that the locating appliance is lying flat on a measurement area.

11. The locating appliance according to claim 1, further comprising:
    a displacement sensor configured to sense a displacement of the locating appliance relative to the article,
    wherein the locating appliance is configured to associate a measurement result from the push-pull measurement bridge with a displacement position.

12. The locating appliance according to claim 1, further comprising:
    a further push-pull measurement bridge having a further electromagnetic device.

13. The locating appliance according to claim 12, wherein at least one of the electromagnetic devices is arranged on that side of the housing which is remote from the output device, within the housing.

14. The locating appliance according to claim 1, further comprising:
    at least one rechargeable battery configured to supply power.

* * * * *